United States Patent [19]

Ohta

[11] Patent Number: 5,293,563
[45] Date of Patent: Mar. 8, 1994

[54] MULTI-LEVEL MEMORY CELL WITH INCREASED READ-OUT MARGIN

[75] Inventor: Yoshiji Ohta, Ikoma, Japan

[73] Assignee: Sharp Kabushiki Kaisha, Osaka, Japan

[21] Appl. No.: 807,054

[22] Filed: Dec. 12, 1991

Related U.S. Application Data

[63] Continuation-in-part of Ser. No. 455,989, Dec. 22, 1989, abandoned.

[30] Foreign Application Priority Data

Dec. 29, 1988 [JP] Japan .................. 63-330970
Mar. 20, 1989 [JP] Japan .................. 1-068880

[51] Int. Cl.[5] .................. G11C 7/00; G11C 11/40
[52] U.S. Cl. .................. 365/190; 365/149; 365/189.01
[58] Field of Search .................. 365/149, 190, 189.01, 365/207

[56] References Cited

U.S. PATENT DOCUMENTS

| | | | |
|---|---|---|---|
| 4,103,342 | 7/1978 | Miersch et al. ............ | 365/149 |
| 4,661,929 | 4/1987 | Aoki et al. ............ | 365/189 |
| 4,715,015 | 12/1987 | Mimoto et al. ............ | 365/210 |
| 4,730,280 | 3/1988 | Aoyama ............ | 365/205 |
| 4,751,557 | 6/1988 | Sunami et al. . | |
| 4,780,751 | 10/1988 | Nishimoto . | |
| 4,791,610 | 12/1988 | Takemae . | |
| 4,855,952 | 8/1989 | Kiyosumi . | |
| 4,858,193 | 8/1989 | Furutani et al. ............ | 365/203 |
| 4,888,631 | 12/1989 | Azuma et al. . | |
| 4,888,733 | 12/1989 | Mobley . | |
| 4,907,047 | 3/1990 | Kato et al. . | |
| 4,935,896 | 6/1990 | Matsumura et al. ............ | 365/149 X |
| 4,947,377 | 8/1990 | Hannai ............ | 365/149 |
| 4,958,318 | 9/1990 | Harari . | |

FOREIGN PATENT DOCUMENTS

| | | | |
|---|---|---|---|
| 0164989 | 8/1985 | Japan ............ | 365/149 |
| 60-246670 | 12/1985 | Japan . | |
| 60-246671 | 12/1985 | Japan . | |
| 61-207055 | 9/1986 | Japan . | |
| 0279597 | 12/1987 | Japan ............ | 365/190 |
| 63-217656 | 9/1988 | Japan . | |

OTHER PUBLICATIONS

"A Survey of Multivalued Memories," Rich, *IEEE Transactions on Computers*, vol. C-35, No. 2, Feb. 1986, pp. 99-106.

"A Novel Memory Cell Architecture for High-Density DRAMs," Ohta et al., *Symposium on VLSI Circuits 1989*, published by IEEE, May 1989, pp. 101-102.

*Primary Examiner*—Eugene R. LaRoche
*Assistant Examiner*—Son Dinh
*Attorney, Agent, or Firm*—Merchant, Gould, Smith, Edell, Welter & Schmidt

[57] ABSTRACT

A dynamic semiconductor memory device for storing a signal corresponding to two bits of digital data in a single memory cell. A memory cell consisting of two transistors and one capacitor is formed. Logic is provided to convert two bits of data to two levels of charge with two different polarities. The result is a memory device which requires only 1½ elements per bit of storage in contrast to the two elements per bit of storage needed in conventional memory cells.

9 Claims, 14 Drawing Sheets

MULTI-LEVEL MEMORY CELL WITH INCREASED READ-OUT MARGIN

This is a Continuation-In-Part application of U.S. patent application Ser. No. 07/455,989 filed Dec. 22, 1989 abandoned.

BACKGROUND OF THE INVENTION

1. Field of the Invention

The present invention relates to an improved dynamic semiconductive memory device, and more particularly to a dynamic semiconductive memory device capable of storing more than one bit in a cell.

2. Background Information

Although high integration techniques have permitted increasingly dense topographies in dynamic semiconductor memory fabrication, the constitution of the memory cell employing two elements consisting of one transistor and one capacitor per bit has not changed.

A typical dynamic semiconductor memory device is shown in FIG. 1. In FIG. 1, reference numeral 20 indicates a memory cell in a conventional dynamic semiconductor memory system. Memory cell 20 comprises a storage capacitor 21, a storage node 23 and a transfer gate transistor 22 for use in selecting the memory cell.

Reductions in the size of a memory cell such as cell 20 are limited by the capacitance required in capacitor 21 to avoid excessive soft errors due to alpha particles. Therefor further integration has been marked by attempts to reduce the area covered by a capacitor 21 while keeping its capacitance approximately the same. These attempts have led to three-dimensional structures such as grooves or stacks.

However, there are many problems in the production of such a three-dimensional memory cell and the development time needed to develop such a cell is burdensome.

SUMMARY OF THE INVENTION

An essential object of the present invention is to provide a memory cell for storing data corresponding to two bits within each cell. This is done by forming a memory cell from two transistors and one capacitor. The result is a memory device which requires only 1½elements per bit of storage in contrast to the two elements per bit of storage needed in conventional memory cells.

In order to accomplish the object mentioned above, a dynamic semiconductor memory device of the present invention comprises complementary first and second bit lines for transmitting input and output data signals, storage capacitor means for storing data signals, and first and second selecting means for designating said storage capacitor means, and said memory device comprises a memory cell structure in which one terminal of said storage capacitor means is connected to said complementary first bit line through said first selecting means and the other terminal of said storage capacitor means is connected to said complementary second bit line through said second selecting means, wherein in said memory cell are stored data signals of four values corresponding to two bits with positive and negative bi-polarities and two levels of storage electric charges, whereby the memory cell with an average of 1.5 elements per one bit can be realized with a read-out margin larger than that of the conventional memory device.

Features of the present invention which are believed to be novel are set forth with particularity in the appended claims. The present invention together with further objects and advantages thereof may best be understood with reference to the following detailed description, taken in conjunction with the accompanying drawings.

DETAILED DESCRIPTION OF THE PREFERRED EMBODIMENT

In the following detailed description of the preferred embodiments, reference is made to the accompanying drawings which form a part hereof, and in which is shown by way of illustration specific embodiments in which the invention may be practiced. In particular, EMBODIMENTS 1 and 5, illustrated in FIGS. 2 and 12, respectively, are capable of storing data of three values while EMBODIMENTS 2, 3 and 4, illustrated in FIGS. 6, 7 and 8, respectively, are capable of storing data of four values. It is to be understood that other embodiments may be utilized and structural changes made without departing from the scope of the present invention.

Figure 1:
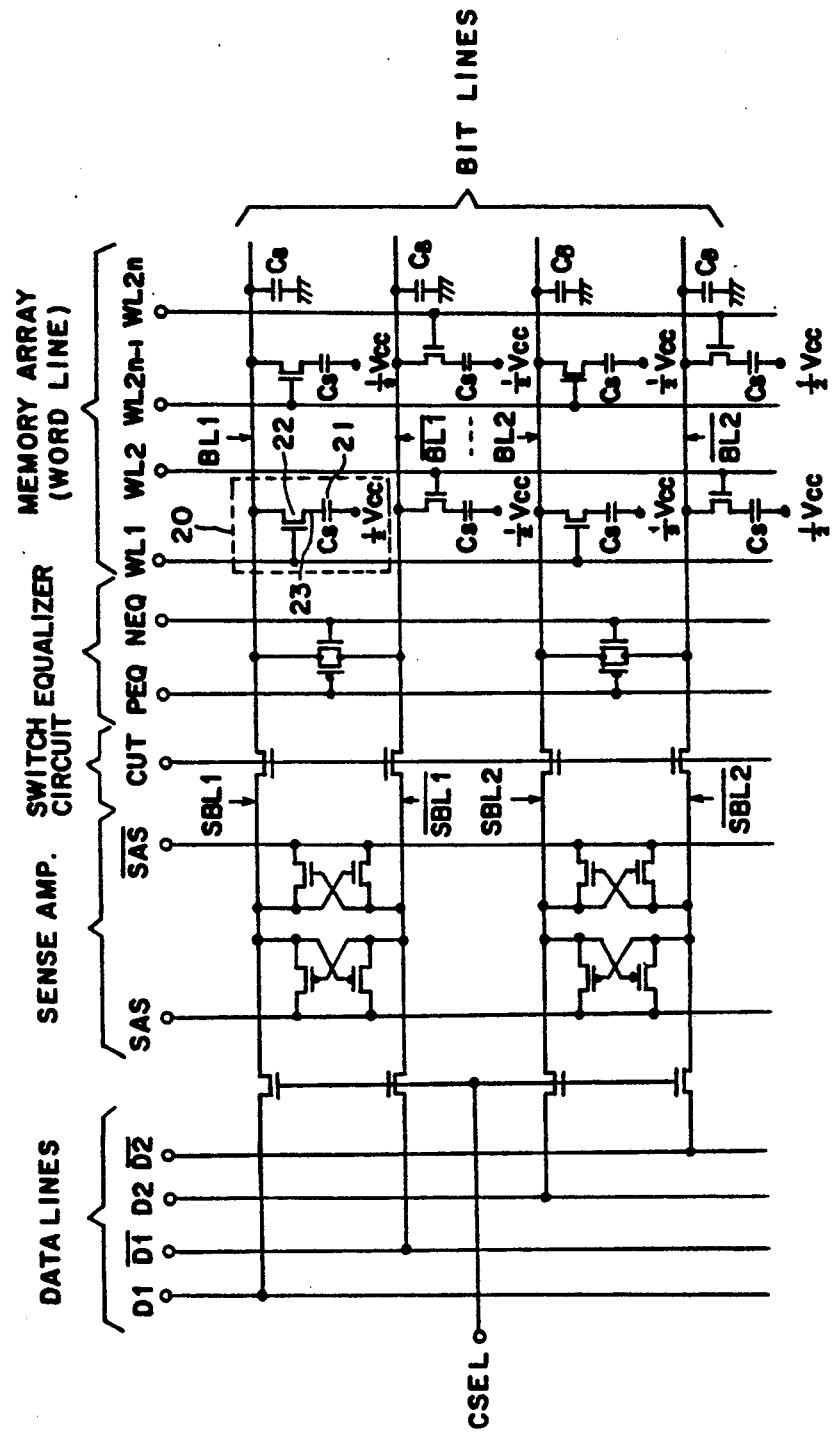
FIG. 1 is a circuit diagram showing the structure of a conventional dynamic semiconductor memory device.
Figure 2:
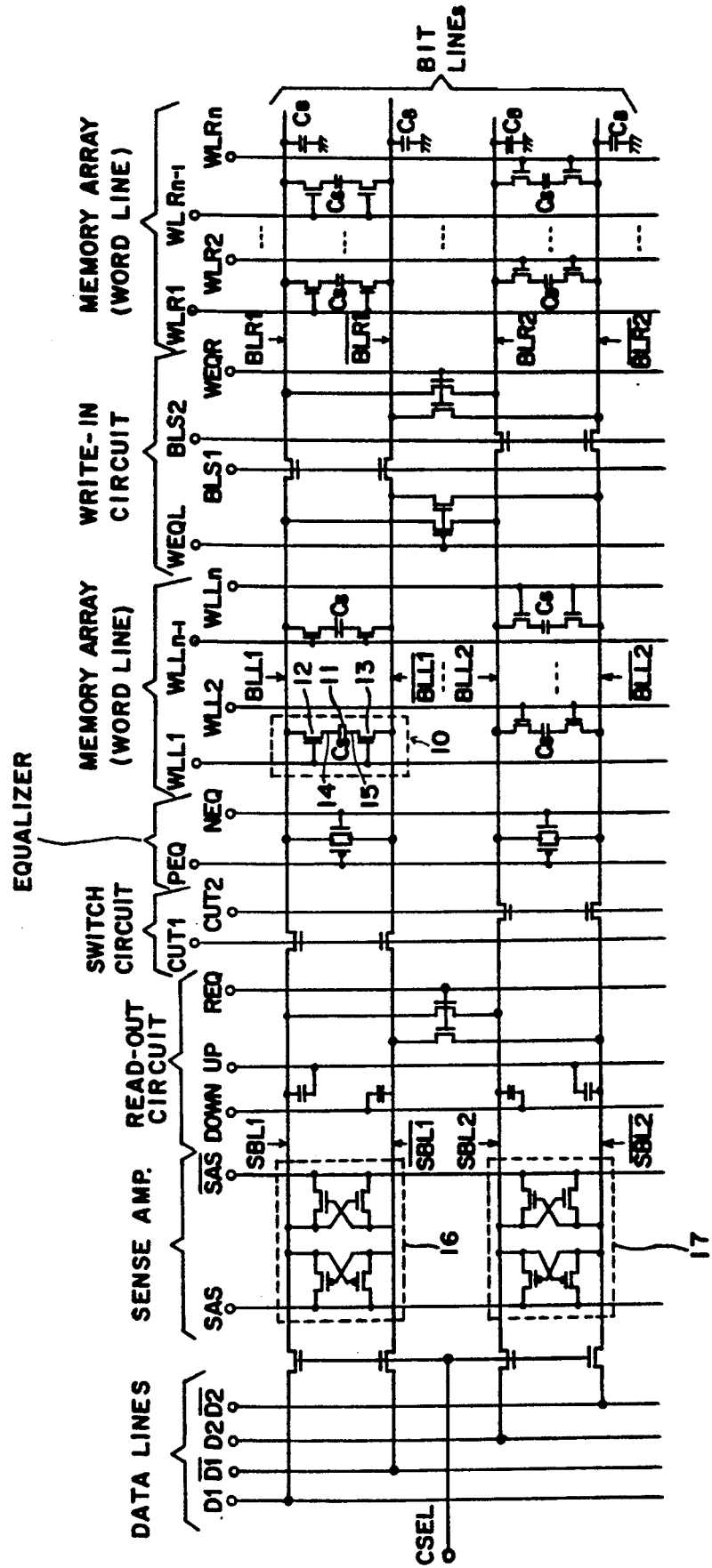
FIG. 2 is a circuit diagram showing a structure of a first embodiment of a dynamic semiconductor memory device according to the present invention.

In FIG. 2 reference numeral 10 denotes a memory cell for storing data of four values corresponding to two bits in a device according to the present invention, reference numeral 11 denotes a storage capacitor, reference numerals 12 and 13 denote transfer gate transistors which act as first and second selecting means, reference numerals 14 and 15 denote storage nodes, and reference numerals 16 and 17 denote sense amplifiers each of which is constructed of two pairs of N-channel and P-channel MOSFETs.

The operation of the circuit arrangement of the device shown in FIG. 2 is explained as following.

The operations such as reading, re-writing, precharge and writing operations of the memory cell 10 selected and designated by a word line WLL1 and complementary bit lines $\overline{BLL1}$ and BLL1, are described with reference to FIGS. 2-5.

potential level H corresponds to the voltage of Vcc and a potential level L corresponds to the voltage of GND (ground level).

TABLE 1

| DATA | D1=H D2=H | D1=H D2=L | D1=L D2=H | D1=L D2=L |
|---|---|---|---|---|
| NODE 14 | Vcc | 2/3Vcc | 1/3Vcc | GND |
| NODE 15 | GND | 1/3Vcc | 2/3Vcc | Vcc |

(1) Reading Operation

Figure 3:
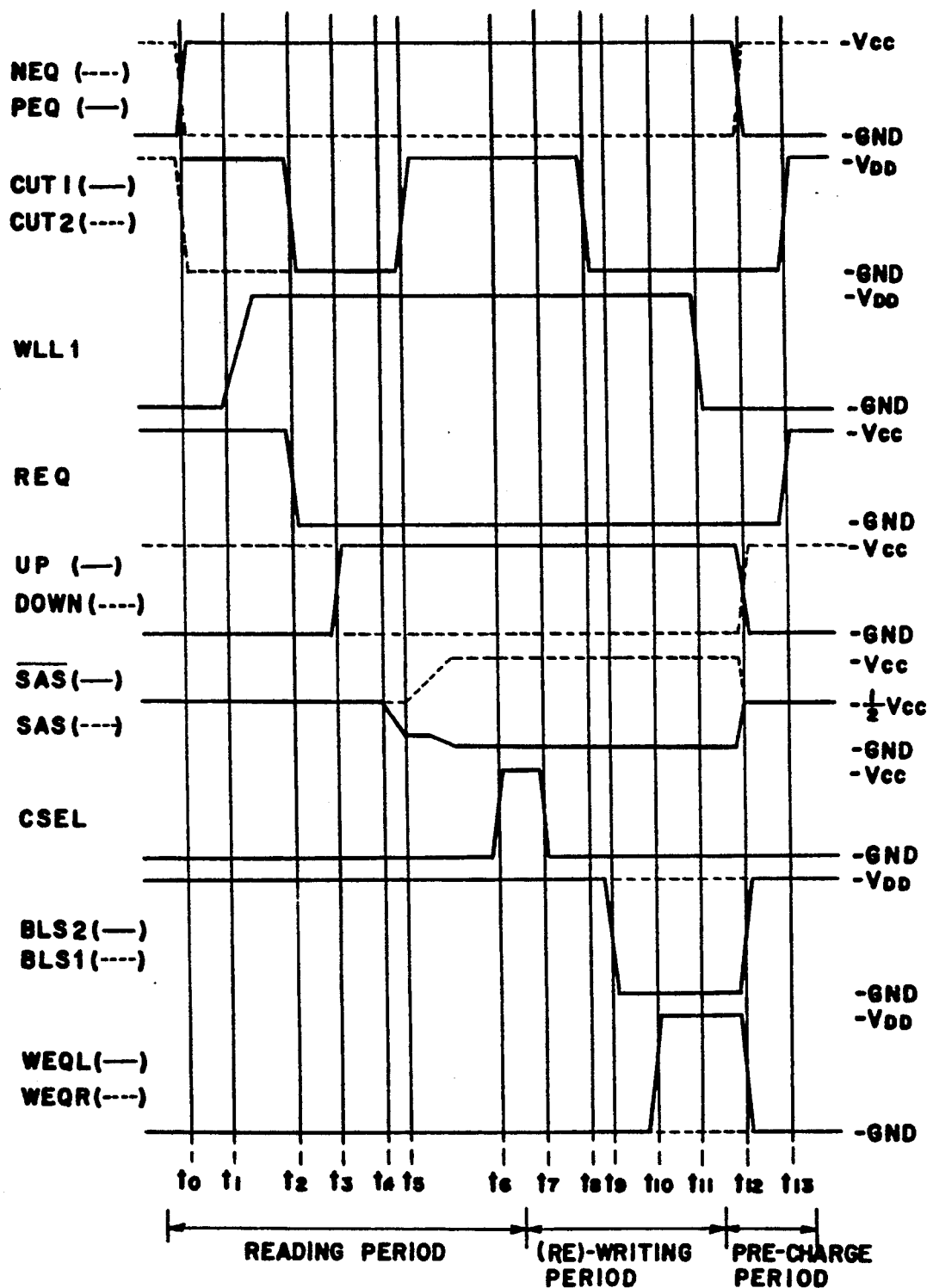
FIG. 3 is a timing chart of input waveforms for explaining the operation of the circuit shown in FIG. 2, FIGS. 4 and 5 are timing charts showing waveforms of bit lines at the time of reading out data for explaining the operation of the circuit shown in FIG. 2.

In FIG. 3, when the waveforms of the input voltage levels of lines NEQ and PEQ of a bit line equalizer circuit shown in FIG. 2 are respectively raised up and fallen down at the time $t_0$ as shown in FIG. 3, the transistors provided in the bit line equalizer circuit are switched off and the precharge operation of the bit lines is complete. The voltage levels of both of the bit lines are set to half of a power source voltage (Vcc).

Subsequently, when the memory cell 10 connected between the bit lines BLL1 and $\overline{BLL1}$ is selected, the transistors on the line CUT2 in a switch-off circuit for switching between the bit lines and sense amplifiers are switched off and the voltage level of the word line WLL1 in the first memory array circuit is raised up at the time $t_1$.

Then the charges of the data stored in the storage capacitor 11 are transferred through the first transfer gate 12 to the bit lines BLL1, SBL1 and SBL2 and transferred through the second transfer gate 13 to the bit lines $\overline{BLL1}$, $\overline{SBL1}$ and $\overline{SBL2}$ so as to be transferred to the sense amplifiers 16 and 17.

Subsequently, when the potential levels of the lines CUT1 and REQ are fallen down at the time $t_2$, the bit lines BLL1, $\overline{BLL1}$ and BLL2, $\overline{BLL2}$ each having a memory cell connected therebetween are separated from the sense amplifiers and also the bit lines SBL1 and SBL2, $\overline{SBL1}$ and $\overline{SBL2}$ are separated. The result is that differential data signals corresponding to the charge levels stored in the memory cell 10 are received by sense amplifiers 16 and 17 at time $t_2$.

Then, at time $t_3$, the potential level of lines UP and DOWN are respectively raised up and reduced as shown in FIG. 3. At time $t_4$, the sense amplification is started by a line $\overline{SAS}$ of sense amplifiers 16 and 17 and then the potential levels of the lines CUT1 and CUT2 are raised up at the time $t_5$, so that the bit lines BLL1, $\overline{BLL1}$ and BLL2, $\overline{BLL2}$ in the side of the first memory array circuit are respectively connected to the sense amplifiers 16 and 17, whereby the pull-up operation is performed by the sense amplification line $\overline{SAS}$.

In the last step, the potential level of a line CSEL is raised up at the time $t_6$ and the data signals sent from the memory cell and amplified by the amplifiers 16 and 17 are transferred to the data lines, so that the read-out operation for reading out the data signals stored in the memory cell is completed.

The variations of the potential levels of the bit lines SLB1 $\overline{SLB1}$ and SBL2, $\overline{SBL2}$ at the time $t_3$ are explained as follows.

Figure 4:
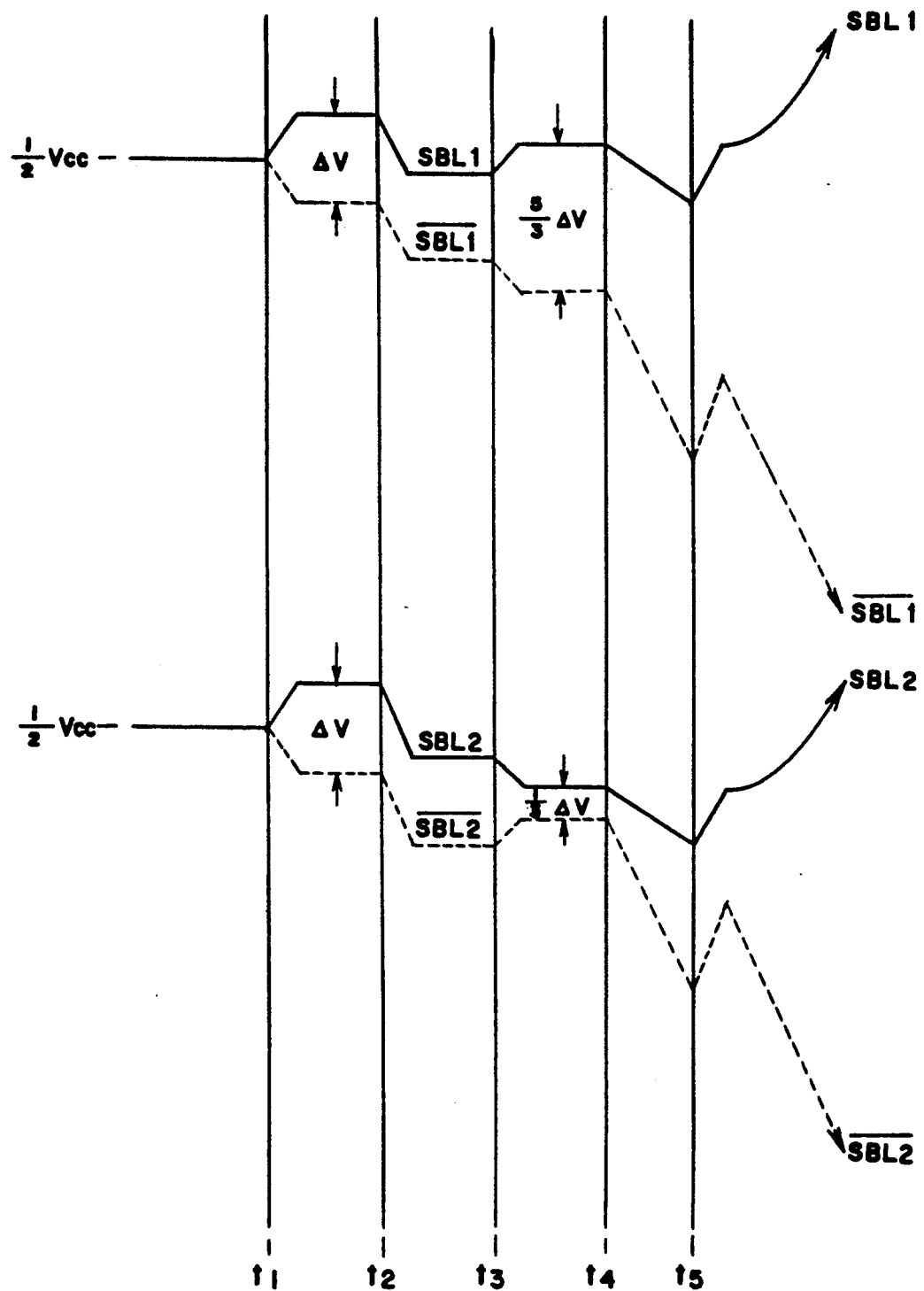
Figure 5:
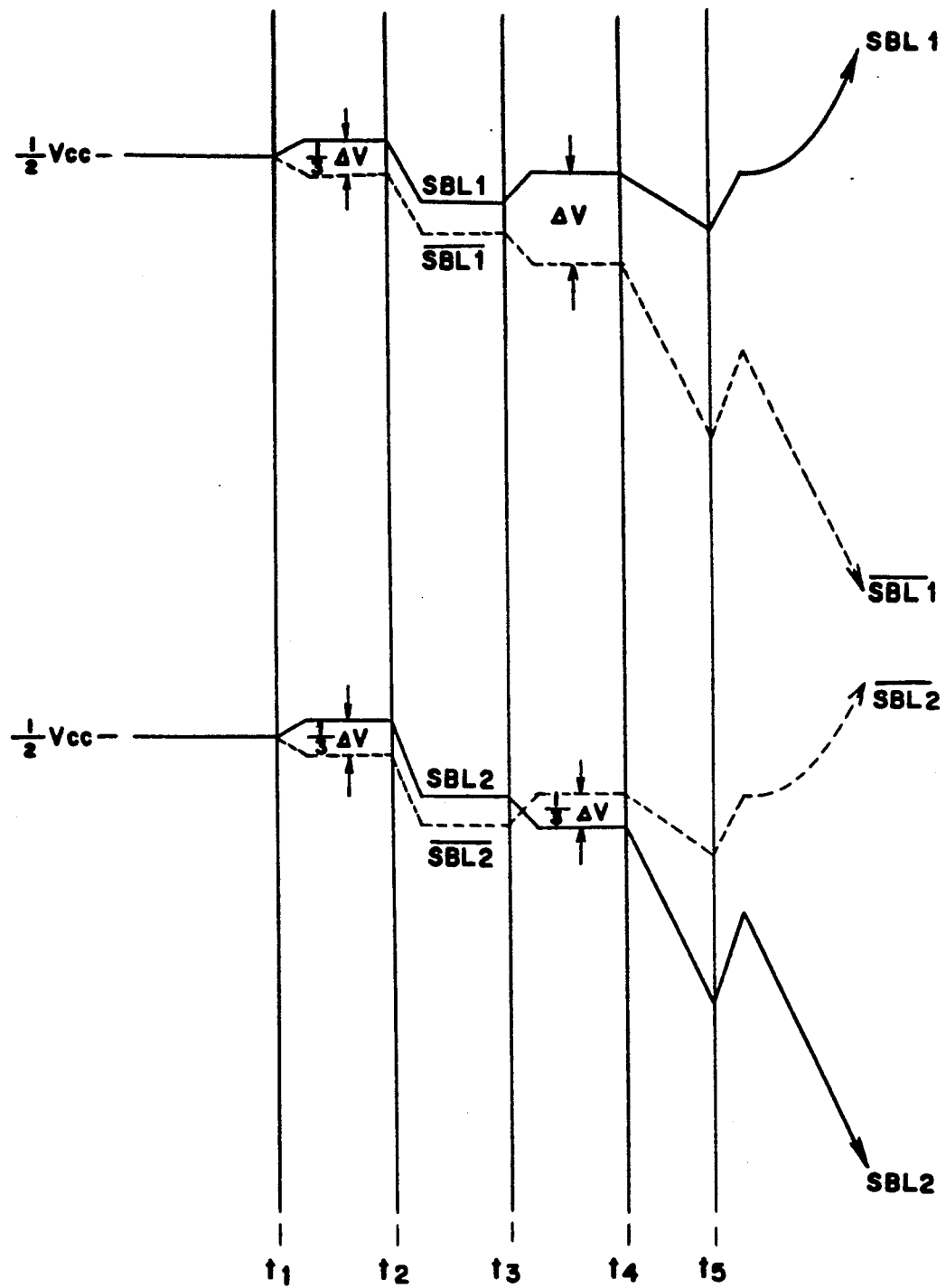

Since the memory cell of the present invention stores data of two bits in one storage capacitor, there are four cases of voltage levels of the storage nodes 14 and 15 when the memory cell stores the data as shown in the Table 1. In the Table 1, DATA represents the data signals stored through the data lines D1 and D2, and a FIG. 4 shows the condition when the data of (D1=H D2=H) are read out in the Table 1, and FIG. 5 shows the condition when the data of (D1=H D2=L) are read out. In the case that the data of (D1=L D2=L) are read out through the data lines D1 and D2, upon replacing SBL1 with $\overline{SBL1}$ and $\overline{SBL2}$ with SBL2 in FIG. 4 and in the case that the data of (D1=L D2=H) are read out, upon replacing SBL1 with $\overline{SBL2}$ and SBL2 with $\overline{SBL1}$ in FIG. 5, equivalent figures can be obtained. Therefore, it will be enough to explain the reading operation only in the former two cases, i.e. only when the data of (D1=H D2=H and D1=H D2=L) are read out. (NOTE: the circuit of the first embodiment is not capable of distinguishing (D1=H, D2=L) from (D1=L, D2=H). Therefore, this circuit is capable of storing and reading only three levels of data.)

When the data of (D1=H D2=H) are read out in the reading operation, at the time t when the potential level of the word line WLL1 is raised up, there is generated a potential difference or a voltage of $\Delta V$ between the respective pairs of complementary bit lines SBL1 and $\overline{SBL1}$, SBL2 and $\overline{SBL2}$ shown in FIG. 4. At the time $t_3$ when the potential levels of the UP and DOWN lines are raised up and reduced, respectively, the potential levels of the lines SBL1 and $\overline{SBL2}$ are raised up by $\frac{1}{3} \Delta V$ and the potential levels of the lines $\overline{SBL1}$ and SBL2 are reduced by $\frac{1}{3} \Delta V$.

As can be seen in FIG. 4, this operation does not change the polarities of the bit lines and therefore, after performing the sense operation after the time $t_4$, the output voltage levels of the power source voltage Vcc are generated as the output data of the data lines D1 and D2.

On the other hand, when the data of (D1=H D2=L) are respectively read out during time $t_1$ in the read operation, there are generated potential differences of only $\frac{1}{3} \Delta V$ between the respective pairs of complementary bit lines SBL1 and $\overline{SBL1}$, SBL2 and $\overline{SBL2}$ as shown in FIG. 5. Then, when at time $t_3$ the potential levels of the lines SBL1 and $\overline{SBL2}$ are raised up by $\frac{1}{3} \Delta V$ and the potential levels of the lines $\overline{SBL1}$ and SBL2 are reduced by $\frac{1}{3} \Delta V$, the polarity between SBL2 and $\overline{SBL2}$ changes. Therefore, after performing the sense operation after the time $t_4$, the output voltages of Vcc level and GND level are generated as the outputs of the data lines D1 and D2 respectively.

Moreover, assuming that the incidental capacitance of the bit lines is CB and the storage capacitance of the memory cell is CS, the value of $\frac{1}{3} \Delta V$ is represented as follows:

$$\tfrac{1}{3} \Delta V = CS/(CB + 2CS) \times \tfrac{1}{2} Vcc$$

When the ratio of CB/CS is two or more than two, the above mentioned value of $\frac{1}{3} \Delta V$ is more than the value $\Delta V$ in the conventional memory system as following:

$$\Delta V = CS/(CB + CS) \times \tfrac{1}{2} Vcc$$

Therefore, since the practical ratio of CB/CS is about 10, the reading voltages or read-out margins of the bit lines are larger in the device of the present invention than in the conventional device.

(2) Rewrite-In Operation

As shown in FIG. 3, the potential level of the line CSEL is fallen down at the time $t_7$ when the rewrite-in operation is started, so that the data lines are disconnected from the sense amplifier circuit, and then the potential levels of the lines CUT1 and CUT 2 are fallen down at the time $t_8$ so that the sense amplifiers are also disconnected from the bit lines of the equalizer circuit.

Thus, after the bit lines in the side of the first memory array are set in an electrically floating condition, the voltage level $V_{DD}$ of the line BLS2 in the writing circuit is fallen down to the level of GND at the time $t_9$, so that the bit lines BLL2, BLR2 and $\overline{BLL2}$, $\overline{BLR2}$ which are not connected to the memory cell 10 are divided into two groups.

Subsequently, the voltage level of the WEQL line in the write-in circuit is raised up, so that the line BLL2 is connected to the lines BLL1 and BLR1 and also the line $\overline{BLL2}$ is connected to the lines $\overline{BLL1}$ and $\overline{BLR1}$.

Consequently, the voltage levels of the bit lines are varied as shown in the Table 2, so that in the storage nodes 14 and 15 of the selected memory cell 10 are written the data signals having the same voltages as those before the word line WLL1 is raised up and in the storage capacitor 11 is stored electric charge corresponding to the voltage of the written data signals.

Then the voltage level of the word line WLL1 is fallen down at the time $t_{11}$ and the rewrite-in operation is completed.

(of GND) of the data to be written and the read-out data of the bit lines are replaced with the written data after the time $t_6$.

In the operation after the time $t_7$, new data are written in the memory cell by an operation similar to that in the rewrite-in operation (2).

EMBODIMENT 2

Figure 6:
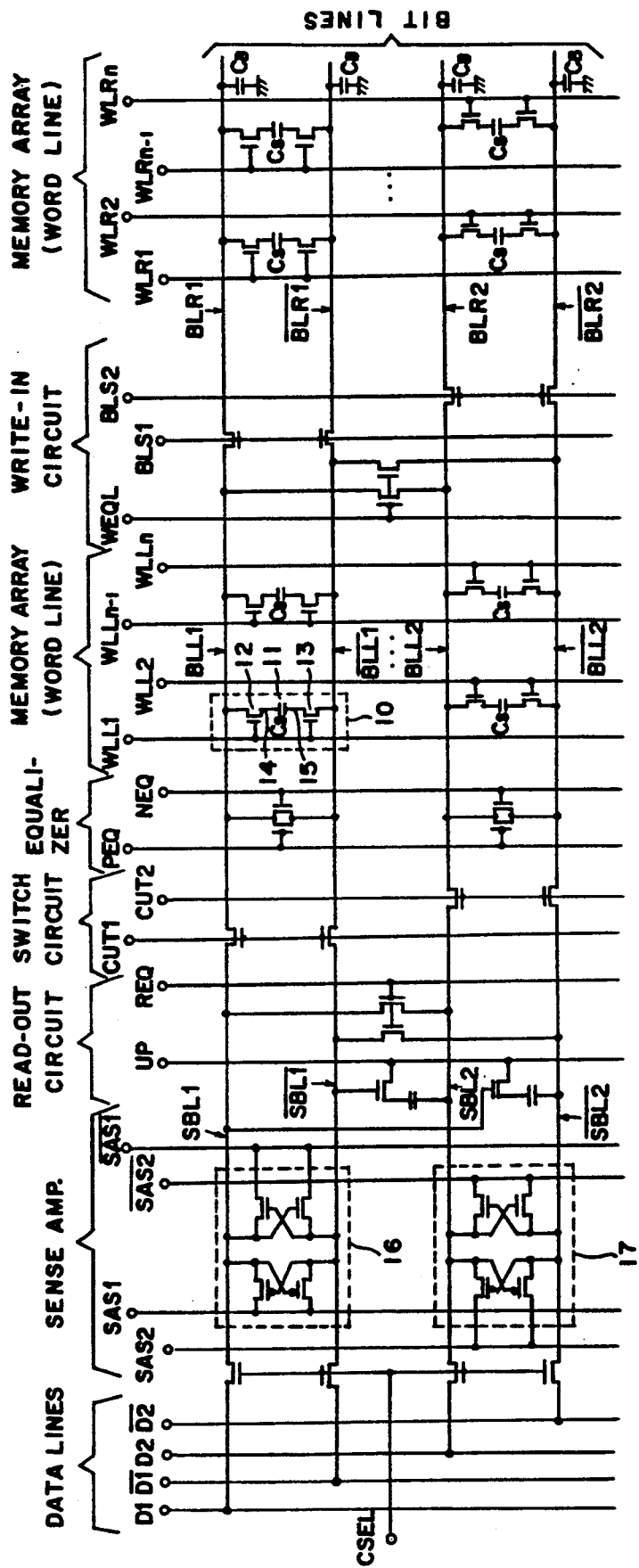
FIG. 6 is a circuit diagram showing a structure of a second embodiment of a dynamic semiconductor memory device according to the present invention.

A second embodiment of the present invention is explained with reference to FIG. 6. The main constructional difference between the first embodiment and the second embodiment is in that, in the second embodiment, the READ-OUT and SENSE AMPLIFIER circuits are modified to provide digital data corresponding to four levels stored in the memory cell. In particular, two pairs of lines SAS1, SAS2 and $\overline{SBL1}$, $\overline{SBL2}$ are provided for the sense amplifiers 16 and 17, and the operation of sense amplifier 17 is delayed more than that of sense amplifier 16, whereby only the pair of bit lines SBL2 and $\overline{SBL2}$ can be boosted by the storage charge of the capacitors connected to the UP line in the read-out circuit. The other structure of the second embodiment is similar to that of the first and fourth embodiments.

EMBODIMENT 3

Figure 7A:
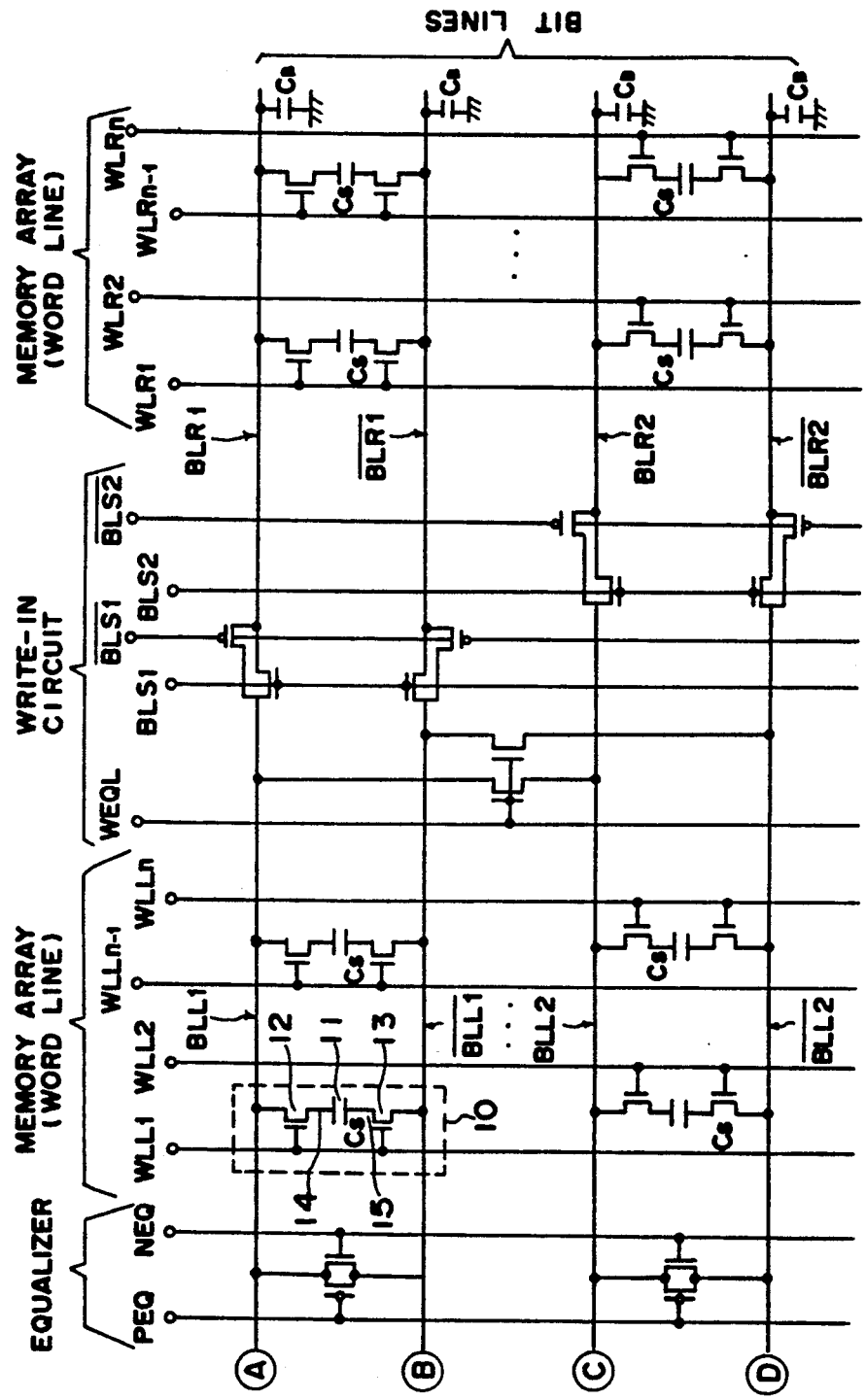
FIGS. 7a and 7b are circuit diagrams showing a structure of a third embodiment of a dynamic semiconductor memory device according to the present invention.
Figure 7B:
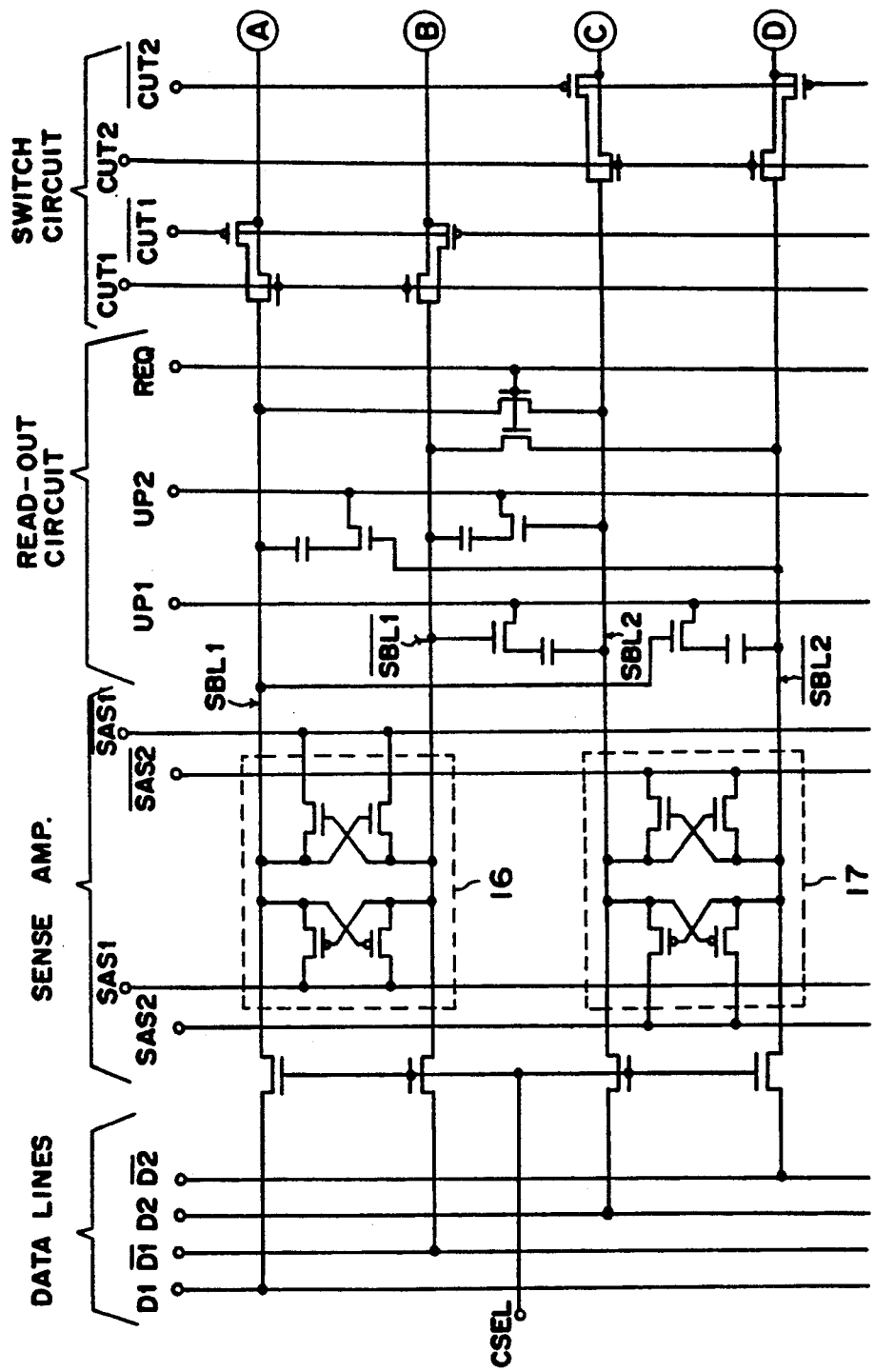

A third embodiment of the present invention is shown in FIGS. 7a and 7b. The differences from the second embodiment shown in FIG. 6 lie in that not only the pair of bit lines SBL2 and $\overline{SBL2}$ but also the pair of bit lines SBL1 and $\overline{SBL1}$ can be boosted by the read-out circuit. Further, it is not necessary to provide a transfer gate transistor acting as the gate of the line WEQR in the write-in circuit. Moreover, in this embodiment, the

TABLE 2

| | DATA | D1=H D2=H | D1=H D2=L | D1=L D2=H | D1=L D2=L |
|---|---|---|---|---|---|
| BE-FORE $t_{10}$ | BLL1 BLR1 NODE 14 | Vcc | Vcc | GND | GND |
| | BLL2 | Vcc | GND | Vcc | GND |
| | BLL1 BLR1 NODE 15 | GND | GND | Vcc | Vcc |
| | BLL2 | GND | Vcc | GND | Vcc |
| AFTER $t_{10}$ | BLL1 BLR1 BLL2 NODE 14 | Vcc | 2/3Vcc | 1/3Vcc | GND |
| | BLL1 BLR1 BLL2 NODE 15 | GND | 1/3Vcc | 2/3Vcc | Vcc |

(3) Precharge Operation

In the subsequent precharge operation, the voltage levels of the lines UP, DOWN, BLS2, WEQL, NEQ and PEQ are returned to the starting condition of the operation cycle and the voltage levels of the bit lines in the side of the memory cell 10 are made equal to half of the power source voltage Vcc by charge division and also the voltage levels of the lines SAS and $\overline{SAS}$ are returned to $\frac{1}{2}$ Vcc so that the sense amplifiers are stopped.

In the last step, the voltage levels of the lines CUT1, CUT2 and REQ are raised up so that the precharge operation is completed.

(4) Write-In Operation

In the read-out operation, the data lines are set in the floating condition until the voltage level of the line CSEL is raised up at the time $t_6$ as shown in FIG. 3. On the other hand, in the write-in operation for writing the data in the memory cell, the voltage levels of the data lines are fixed to the High level (of Vcc) or Low level transfer gate transistors of the switch circuit and of the write-in circuit are made complementary type circuits. The other structures of the third embodiment are similar to that of the fourth embodiment.

As described above, according to the present invention shown in the second and third embodiments, since the memory cell with 1.5 elements per one bit can be accomplished with a read-out margin larger than that of the conventional memory device when sensing the read out data, the dynamic semiconductor memory device can be obtained with remarkably high packaging density and low power dissipation.

EMBODIMENT 4

Figure 8A:
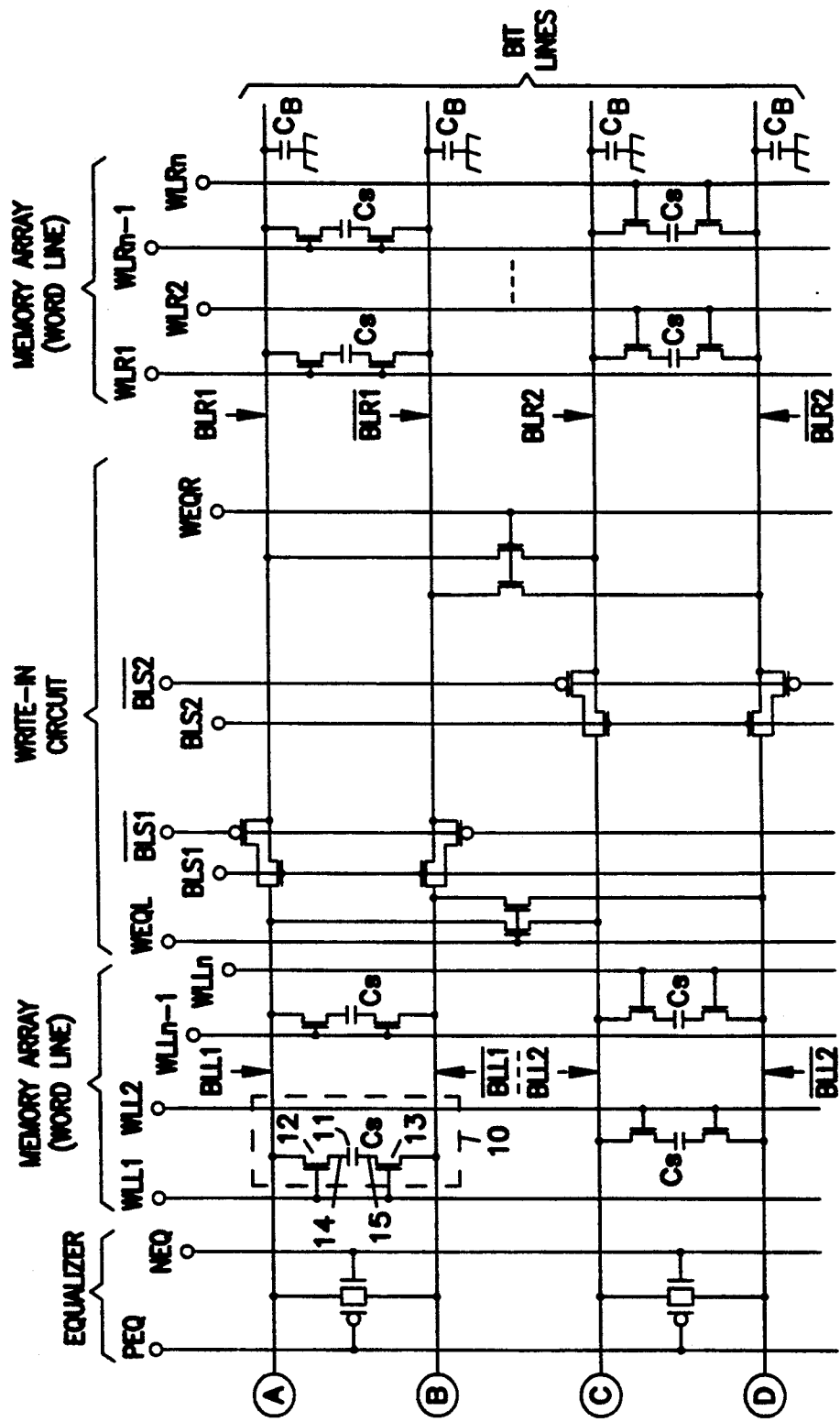
FIG. 8a and 8b are circuit diagrams showing a structure of a fourth embodiment of a dynamic semiconductor memory device according to the present invention.
Figure 8B:
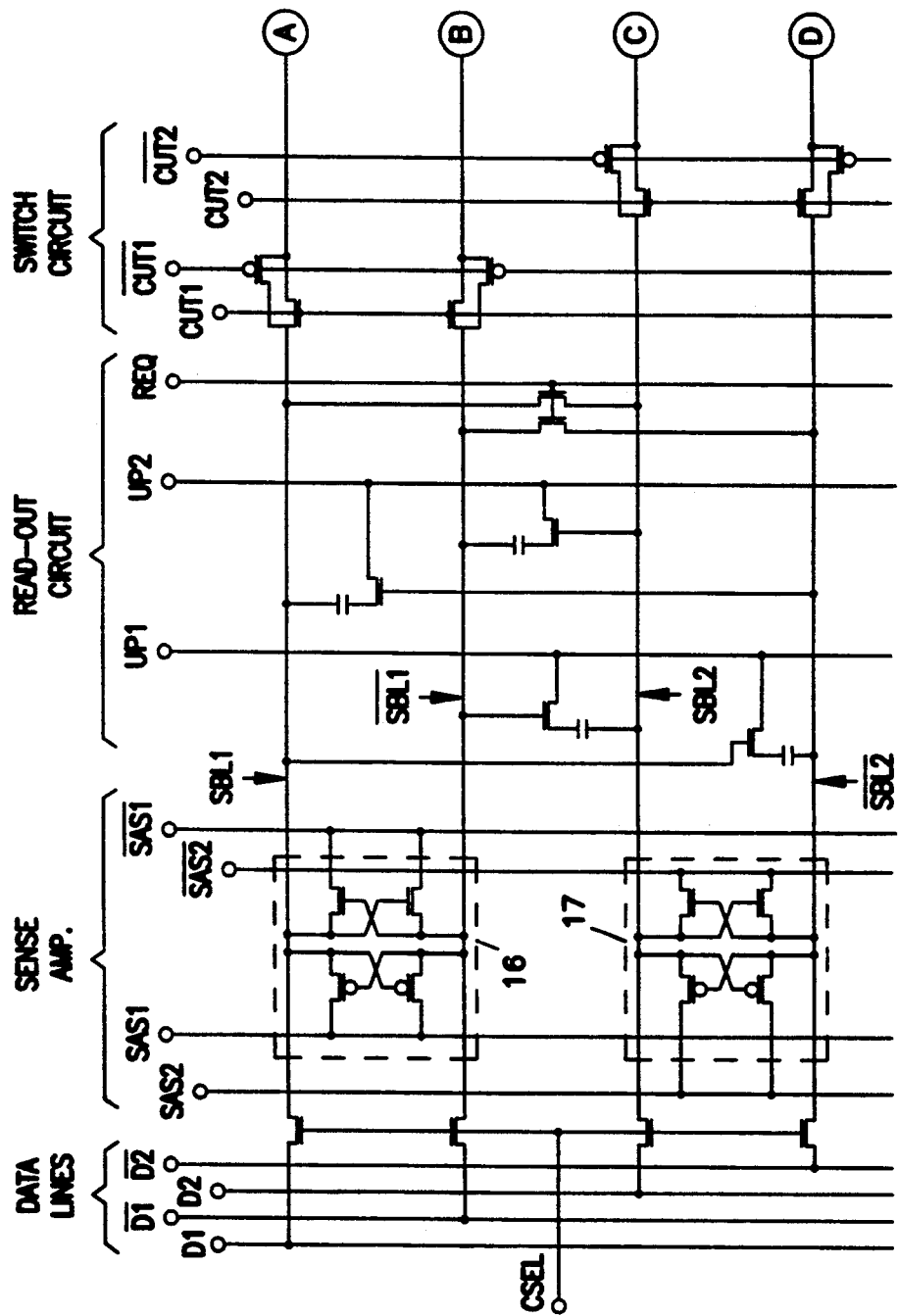

A fourth embodiment of the present invention is shown in FIGS. 8a and 8b. The difference from the third embodiment shown in FIGS. 7a and 7b is in the addition of a transfer gate transistor acting as the gate of the line WEQR in the write-in circuit.

The operation of the circuit arrangement of the device shown in FIGS. 8a and 8b is explained as following.

The operations such as reading, re-writing, precharge and writing operations of the memory cell 10 selected and designated by a word line WLL1 and complementary bit lines BLL1 and $\overline{\text{BLL1}}$, are described with reference to FIGS. 8-11.

(1) Reading Operation

Figure 9:
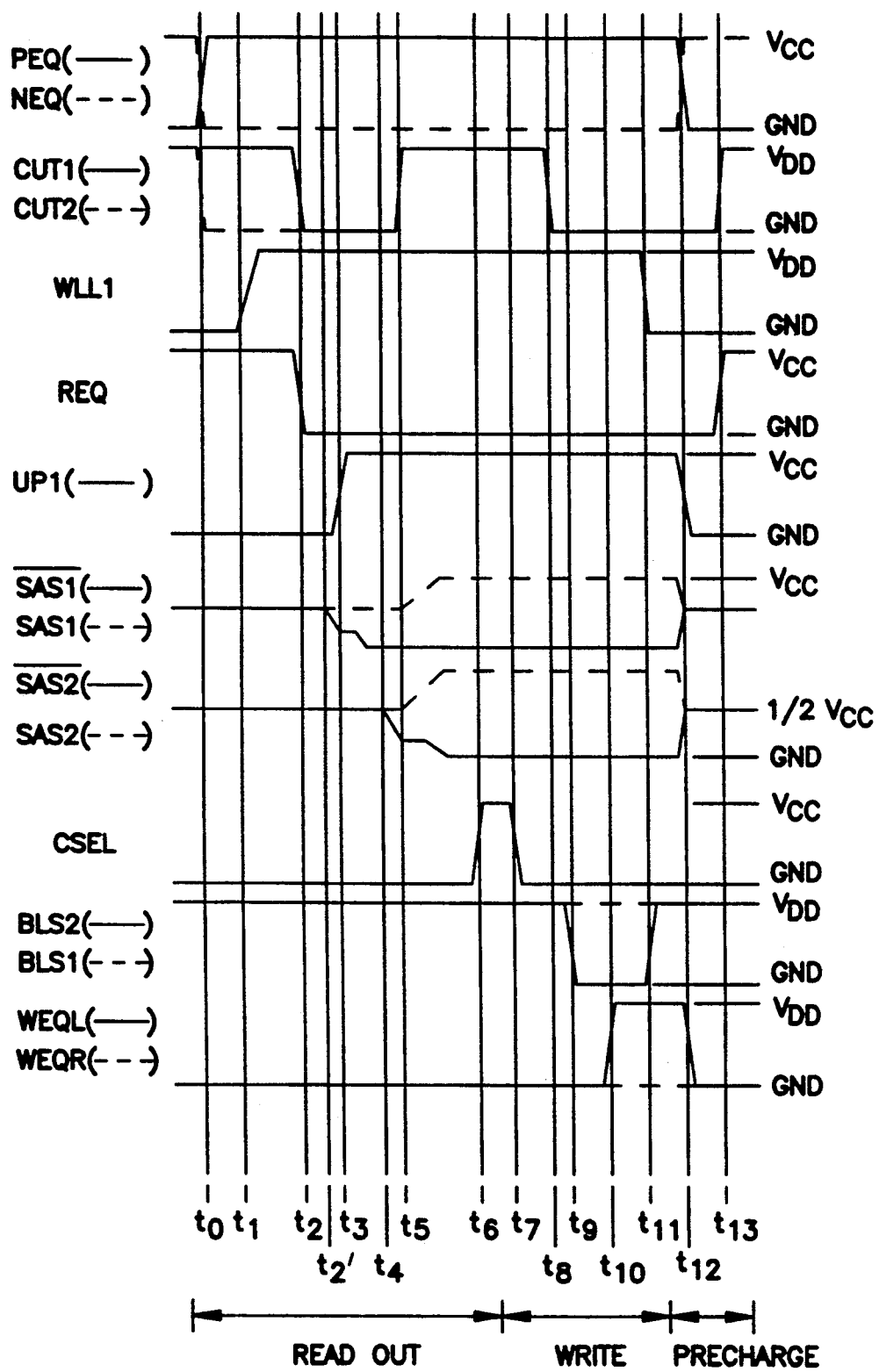
FIG. 9 is a timing chart of input waveforms for explaining the operation of the circuit shown in FIGS. 8a and 8b, FIGS. 10 and 11 are timing charts showing waveforms of bit lines at the time of reading out data for explaining the operation of the circuit shown in FIGS. 8a and 8b.

In FIG. 9, when the waveforms of the input voltage levels of lines NEQ and PEQ of a bit line equalizer circuit shown in FIG. 8a are respectively raised up and fallen down at the time $t_0$ as shown in FIG. 9, the transistors provided in the bit line equalizer circuit are switched off and the precharge operation of the bit lines is complete. The voltage levels of both of the bit lines are set to half of a power source voltage (Vcc).

Subsequently, when the memory cell 10 connected between the bit lines BLL1 and $\overline{\text{BLL1}}$ is selected, the transistors on the line CUT2 in a switch-off circuit for switching between the bit lines and sense amplifiers are switched off and the voltage level of the word line WLL1 in the first memory array circuit is raised up at the time $t_1$.

Then the charges of the data stored in the storage capacitor 11 are transferred through the first transfer gate 12 to the bit lines BLL1, SBL1, and SBL2 and transferred through the second transfer gate 13 to the bit lines $\overline{\text{BLL1}}$, $\overline{\text{SBL1}}$ and $\overline{\text{SBL2}}$ so as to be transferred to the sense amplifiers 16 and 17.

Subsequently, when the potential levels of the lines CUT1 and REQ are fallen down at the time $t_2$, the bit lines BLL1, $\overline{\text{BLL1}}$ and BLL2, $\overline{\text{BLL2}}$ each having a memory cell connected therebetween are separated from the sense amplifiers and also the bit lines SBL1 and SBL2, $\overline{\text{SBL1}}$ and $\overline{\text{SBL2}}$ are separated. The result is that differential data signals similar to the sense amplifiers 16 and 17 individually receive those stored in the memory cell 10. At time $t_2'$, sense amplifier 16 is activated to begin the pull-down operation on SBL1 and $\overline{\text{SBL1}}$.

Then, at time $t_3$, the potential level of line UP1 is raised up as shown in FIG. 9. At time $t_4$, the sense amplification is started by a line $\overline{\text{SAS2}}$ of sense amplifier 17 and then the potential levels of the lines CUT1 and CUT2 are raised up at the time $t_5$, so that the bit lines BLL1, $\overline{\text{BLL1}}$ and BLL2, $\overline{\text{BLL2}}$ in the side of the first memory array circuit are respectively connected to the sense amplifiers 16 and 17, whereby the pull-up operation is performed by the sense amplification lines $\overline{\text{SAS1}}$ and $\overline{\text{SAS2}}$.

In the last step, the potential level of a line CSEL is raised up at the time $t_6$ and the data signals sent from the memory cell and amplified by the amplifiers 16 and 17 are transferred to the data lines, so that the read-out operation for reading out the data signals stored in the memory cell is completed.

The variations of the potential levels of the bit lines SLB1, $\overline{\text{SBL1}}$ and SBL2, $\overline{\text{SBL2}}$ at the time $t_3$ are explained as follows.

Since the memory cell of the present invention stores data of two bits in one storage capacitor, there are four cases of voltage levels of the storage nodes 14 and 15 when the memory cell stores the data as shown in the Table 1.

Figure 10:
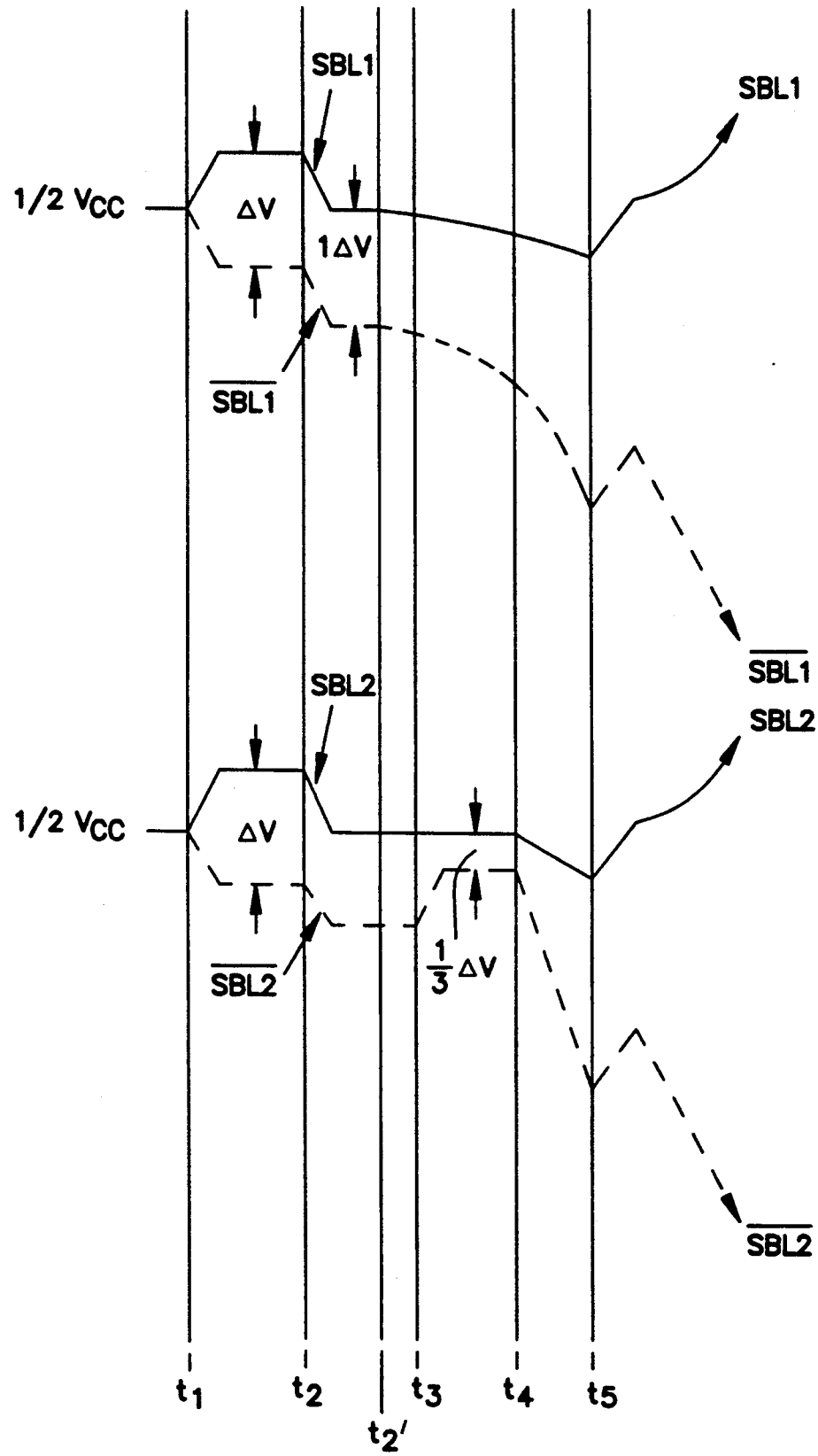
Figure 11:
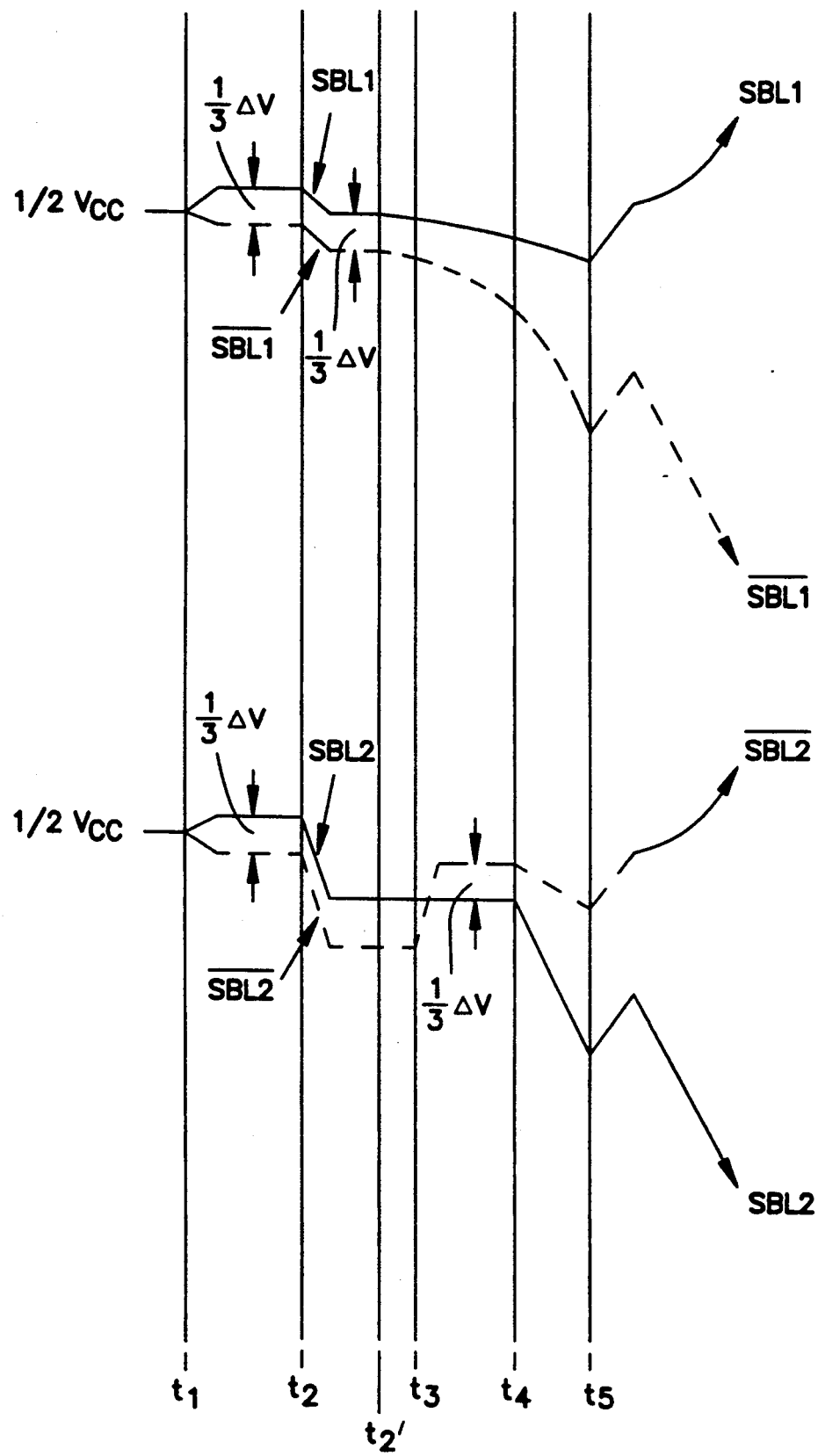

FIG. 10 shows the condition when the data of (D1=H D2=H) are read out in the Table 1, and FIG. 11 shows the condition when the data of (D1=H D2=L) are read out. In the case that the data of (D1=L D2=L) are read out through the data lines D1 and D2, upon replacing SBL1 with $\overline{\text{SBL1}}$ and $\overline{\text{SBL2}}$ with SBL2 in FIG. 10 and in the case that the data of (D1=L D2=H) are read out, upon replacing SBL1 with $\overline{\text{SBL2}}$ and $\overline{\text{SBL1}}$ with SBL2 in FIG. 11, an equivalent circuit can be obtained. Therefore, it will be enough to explain the reading operation only in the former two cases, i.e. only when the data of (D1=H D2=H and D1=H D2=L) are read out.

When the data of (D1=H D2=H) are read out in the reading operation, at the time $t_1$ when the potential level of the word line WLL1 is raised up, there is generated a potential difference or a voltage of $\Delta V$ between the respective pairs of complementary bit lines SBL1 and $\overline{\text{SBL1}}$, SBL2 and $\overline{\text{SBL2}}$ as shown in FIG. 10. At the time $t_3$ when the potential level of the UP line is raised up, the potential level of the line $\overline{\text{SBL2}}$ is raised up by $\frac{1}{3}$ $\Delta V$ by the signal UP1.

As can be seen in FIG. 10, this operation does not change the polarities of the bit lines and therefore, after performing the sense operation after the time $t_4$, the output voltage levels of the power source voltage Vcc are generated as the output data of the data lines D1 and D2.

On the other hand, when the data of (D1=H D2=L) are respectively read out through the data lines D1 and D2, there are generated potential differences of only $\frac{1}{3}$ $\Delta V$ between the respective pairs of complementary bit lines SBL1 and $\overline{\text{SBL1}}$, SBL2 and $\overline{\text{SBL2}}$ as shown in FIG. 11 at the time $t_1$ when the potential level of the word line WLL1 is raised up. Then the potential levels of the line $\overline{\text{SBL2}}$ is raised up by $\frac{1}{3}$ $\Delta V$ by the signal UP1 at the time $t_3$. As the difference between the potential levels of the lines $\overline{\text{SBL2}}$ and SBL2 is only $\frac{1}{3}$ $\Delta V$, the potential levels of the lines SBL2 and $\overline{\text{SBL2}}$ are reversed with respect to each other. Therefore, after performing the sense operation after the time $t_4$, the output voltages of Vcc level and GND level are generated as the outputs of the data lines D1 and D2 respectively.

Moreover, assuming that the incidental capacitance of the bit lines is CB and the storage capacitance of the memory cell is CS, the value of $\frac{1}{3}$ $\Delta V$ is represented as follows:

$$\tfrac{1}{3} \Delta V = CS/(CB+2CS) \times \tfrac{1}{2} Vcc$$

When the ratio of CB/CS is two or more than two, the above mentioned value of $\frac{1}{3}$ $\Delta V$ is more than the value $\Delta V$ in the conventional memory system as following:
$$\Delta V = CS/(CB+CS) \times \tfrac{1}{2} Vcc$$

Therefore, since the practical ratio of CB/CS is about 10, the reading voltages or read-out margins of the bit lines are larger in the device of the present invention than in the conventional device.

(2) Rewrite-In Operation

As shown in FIG. 9, the potential level of the line CSEL is fallen down at the time $t_7$ when the rewrite-in operation is started, so that the data lines are disconnected from the sense amplifier circuit, and then the potential levels of the lines CUT1 and CUT 2 are fallen down at the time $t_8$ so that the sense amplifiers are also disconnected from the bit lines of the equalizer circuit.

Thus, after the bit lines in the side of the first memory array are set in an electrically floating condition, the voltage level $V_{DD}$ of the line BLS2 in the writing circuit is fallen down to the level of GND at the time $t_9$, so that the bit lines BLL2, BLR2 and $\overline{BLL2}$, $\overline{BLR2}$ which are not connected to the memory cell 10 are divided into two groups.

Subsequently, the voltage level of the WEQL line in the write-in circuit is raised up, so that the line BLL2 is connected to the lines BLL1 and $\overline{BLR1}$ and also the line $\overline{BLL2}$ is connected to the lines $\overline{BLL1}$ and $\overline{BLR1}$.

Consequently, the voltage levels of the bit lines are varied as shown in the Table 2, so that in the storage nodes 14 and 15 of the selected memory cell 10 are written the data signals having the same voltages as those before the word line WLL1 is raised up and in the storage capacitor 11 is stored electric charge corresponding to the voltage of the written data signals.

Then the voltage level of the word line WLL1 is fallen down at the time $t_{11}$ and the rewrite-in operation is completed.

The precharge and write operations operate in a manner similar to the first embodiment described.

As described above, according to the embodiment of the present invention shown in the fourth embodiment, since the memory cell with 1.5 elements per one bit can be accomplished with a read-out margin larger than that of the conventional memory device when sensing the read out data, the dynamic semiconductor memory device can be obtained with remarkably high packaging density and low power dissipation.

EMBODIMENT 5

Figure 12:
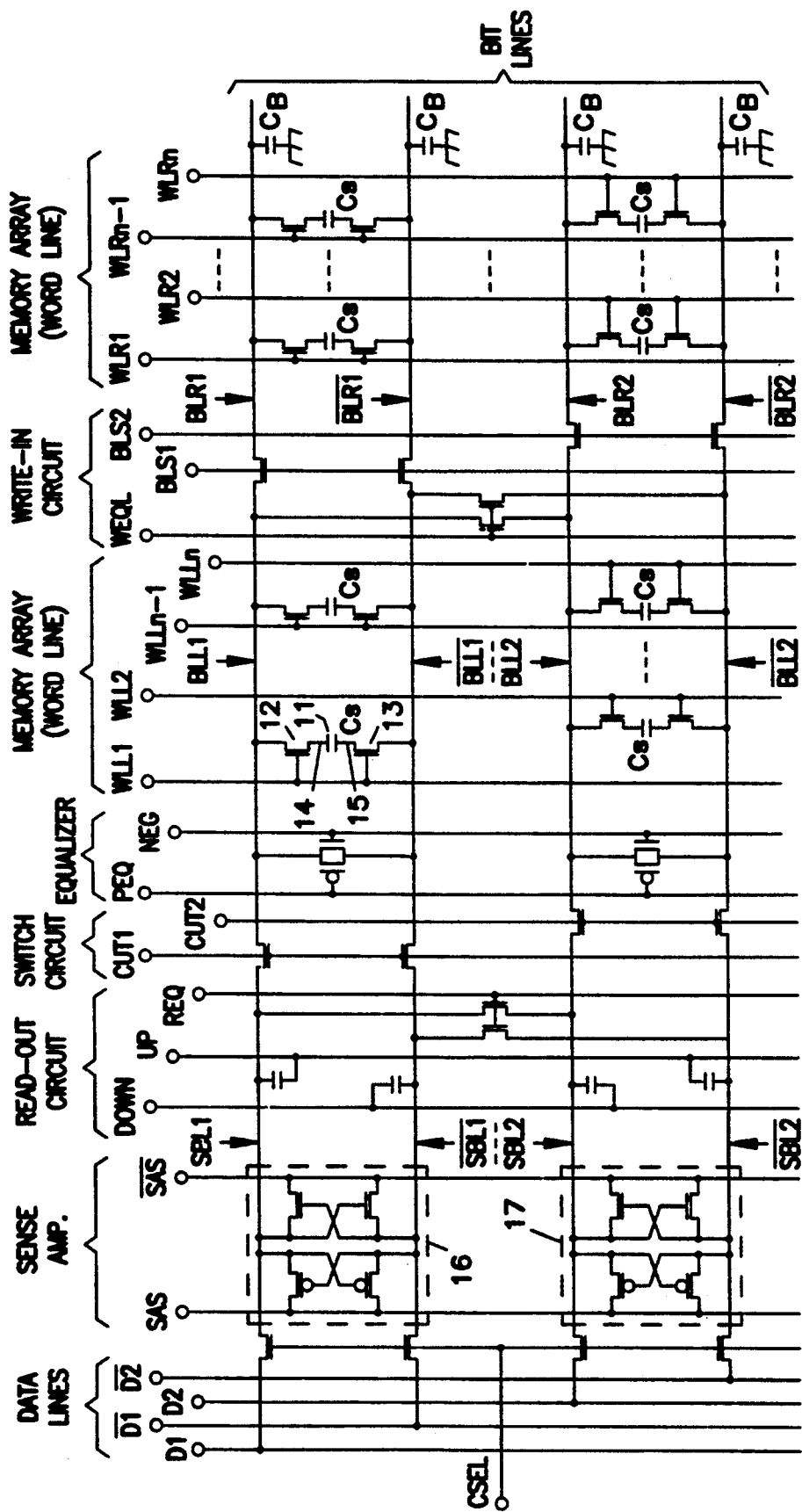
FIG. 12 is a circuit diagram showing a structure of a fifth embodiment of a dynamic semiconductor memory device according to the present invention.

A fifth embodiment of the present invention is explained with reference to FIG. 12. This embodiment is similar to the first embodiment, the difference being that, in this embodiment, a transfer gate transistor acting as the gate of the line WEQR is omitted in the write-in circuit. In this embodiment, there can be stored and read data of only three values in the memory cell.

What is claimed is:

1. A dynamic semiconductor memory device, comprising:
   first and second data line pairs, wherein each data line pair comprises first and second data lines, said first and second data lines being complementary to each other,
   a word line;
   first, second and third bit line pairs, wherein each bit line pair comprises first and second bit lines, said first and second bit lines being complementary to each other;
   a memory cell connected to the word line and the first bit line pair, wherein the memory cell comprises a storage capacitor and first and second selecting means for electrically connecting, under control of the word line, the storage capacitor to the first and second bit lines of said first bit line pair;
   read-out means for reading data stored in said memory cell, wherein the read-out means comprise a first UP line, first and second signal line pairs, first and second capacitors and first and second field-effect transistors, wherein each signal line pair comprises first and second signal lines, said first and second signal lines being complementary to each other, wherein a gate of said first and second field-effect transistors is connected to the second and first signal lines, respectively, of said first signal line pair, wherein a first terminal of said first and second capacitors is electrically connected to the first and second signal lines, respectively, of the second signal line pair, and wherein a second terminal of said first and second capacitors is electrically connected through source-drain paths of said first and second field-effect transistors, respectively, to the first UP line;
   switching means, connected to said first and second bit line pairs and said first and second signal line pairs, for temporarily electrically connecting said first bit line pair to said first signal line pair and said second bit line pair to said second signal line pair;
   equalization means for equalizing the first and second bit line of the first and second bit line pairs, wherein the equalization means comprise a transmission gate formed by connecting first and second field-effect transistors to the first and second bit lines of said first and second bit line pairs;
   a first sense amplifier connected to said first data line pair and said first signal line pair;
   a second sense amplifier connected to said second data line pair and said second signal line pair; and
   write-in means, connected to said first, second and third bit line pairs, for electrically connecting said first, second and third bit line pairs during a write operation.

2. The dynamic semiconductor memory device as claimed in claim 1, wherein said first and second selecting means are respectively first and second field-effect transistors having gates which are commonly connected to the word line.

3. The write-in means as claimed in claim 1 wherein the write-in means comprise first write-in switching means for electrically connecting the first and second bit line pairs and second write-in switching means for electrically connecting the first and third bit line pairs, wherein said first write-in switching means comprises a first field-effect transistor connecting the first bit lines of said first and second bit line pairs and a second field-effect transistor connecting the second bit lines of said first and second bit line pairs and wherein said second write-in switching means comprises a first field-effect transistor connecting the first bit lines of said first and third bit line pairs and a second field-effect transistor connecting the second bit lines of said first and third bit line pairs.

4. The dynamic semiconductor memory device as claimed in claim 1, wherein said storage capacitor stores charge representative of two bits of digital data.

5. The dynamic semiconductor memory device as claimed in claim 1, wherein said read-out means further comprise a second UP line, third and fourth capacitors and third and fourth field-effective transistors, wherein a gate of said third and fourth field-effect transistors is connected to the first and second signal lines, respectively, of said second signal line pair, wherein a first terminal of said third and fourth capacitors is electrically connected to the first and second signal lines, respectively, of the first signal line pair, and wherein a second terminal of said third and fourth capacitors is electrically connected through source-drain paths of said third and fourth field-effect transistors, respectively, to the second UP line.

6. A method of reading two bits of digital data from a single memory cell in a dynamic memory device, wherein the dynamic memory device comprises a memory cell having a storage capacitor with a stored charge; a first bit line pair connected to the memory cell, wherein the first bit line pair comprises a first and a second bit line; a second bit line pair comprising a first and a second bit line; read-out means for reading data stored in the memory cell, wherein the read-out means comprises first and second signal line pairs, each signal line pair having a first and a second signal line; a switch connecting the first bit line pair to the read-out leans; and first and second sense amplifying means, connected to the read-out means, for amplifying a first potential difference between the first and second signal lines of the first signal line pair and a second potential difference between the first and second signal lines of the second signal line pair, the method comprising the steps of:

- equalizing the first and second bit lines of the first bit line pair;
- electrically connecting said storage capacitor to the first and second bit lines of said first bit line pair so as to distribute the charge stored on the storage capacitor on said first and second bit lines;
- electrically connecting the first and second bit lines of the first bit line pair to the first and second signal lines, respectively, of the first and second signal line pairs;
- adding a differential voltage to one of the signal lines of the second signal line pair; and
- converting the first and second potential differences to first and second differential digital data bits, respectively.

7. A method of writing two bits of digital data to a single memory cell in a dynamic memory device, wherein the dynamic memory device comprises a memory cell including a storage capacitor; first, second and third bit line pairs, wherein each bit line pair comprises complementary first and second bit lines and wherein the first bit line pair is connected to the memory cell; data switching means connected to the first and second bit line pairs for applying first and second differential digital signals to the first and second bit line pairs, respectively; first and second data line pairs, coupled through the data switching means to the first and second bit line pairs, respectively, wherein each data line pair comprises complementary first and second data lines; and write-in means, connected to said first, second and third bit line pairs, for electrically connecting said first, second and third bit line pairs during a write operation, wherein the write-in means comprise first write switching means for electrically connecting the first and second bit line pairs and second write switching means for electrically connecting the first and third bit line pairs, the method comprising the steps of:

- providing a true representation of the first and second digital signals on the first data line of the first and second data line pair, respectively;
- providing a complement representation of the first and second digital signals on the second data line of the first and second data line pair, respectively;
- electrically connecting the first and second bit lines of the first and third bit line pairs, respectively;
- electrically connecting the first and second data line pairs to the first and second bit line pairs, respectively, so as to charge the first and second bit line pairs to voltage levels representative of the first and second digital signals, respectively;
- disconnecting the first and second data line pairs from the first and second bit line pairs;
- electrically connecting the first bit line pair to the second bit line pair so as to form, on the first and second bit lines of the first and second bit line pairs, a potential difference between the first and second bit lines of the first bit line pair representative of the first and second digital signals; and
- storing a charge representative of the potential difference in the storage capacitor.

8. The method of writing according to claim 7 wherein the data switching means comprise first and second signal line pairs connected to the first and second data line pairs through first and second column select switching means, respectively, and connected to the first and second bit line pairs through first and second cut switching means; wherein the step of electrically connecting the first and second data line pairs to the first and second bit line pairs, respectively, comprises:

- applying a column select signal to the column select switching means to electrically connect said first data line pair to said first signal line pair and said second data line pair to said second signal line pair; and
- applying a cut signal to the cut switching means to electrically connect said first signal line pair to said first bit line pair and said second signal line pair to said second bit line pair.

9. The dynamic semiconductor memory device according to claim 1 wherein the read-out means further comprise a third field-effect transistor connected between the first signal line of the first and second signal line pairs and a fourth field-effect transistor connected between the second signal lines of the first and second signal line pairs.

* * * * *